United States Patent
Kim et al.

(10) Patent No.: US 11,591,433 B2
(45) Date of Patent: Feb. 28, 2023

(54) PHOTOPOLYMER COMPOSITION

(71) Applicant: LG CHEM, LTD., Seoul (KR)

(72) Inventors: Heon Kim, Daejeon (KR); Yeongrae Chang, Daejeon (KR); Seokhoon Jang, Daejeon (KR); Se Hyun Kwon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/762,009

(22) PCT Filed: Dec. 7, 2018

(86) PCT No.: PCT/KR2018/015470
§ 371 (c)(1),
(2) Date: May 6, 2020

(87) PCT Pub. No.: WO2019/117542
PCT Pub. Date: Jun. 20, 2019

(65) Prior Publication Data
US 2020/0354497 A1    Nov. 12, 2020

(30) Foreign Application Priority Data
Dec. 11, 2017  (KR) .................. 10-2017-0169488

(51) Int. Cl.
| *C08F 2/50* | (2006.01) |
| *C08F 20/18* | (2006.01) |
| *C08F 290/06* | (2006.01) |
| *C08G 18/10* | (2006.01) |
| *C08G 18/42* | (2006.01) |
| *C08G 18/81* | (2006.01) |
| *C08L 75/12* | (2006.01) |
| *C08L 75/06* | (2006.01) |
| *G03F 7/035* | (2006.01) |
| *G11B 7/2535* | (2013.01) |
| *G11B 7/08* | (2006.01) |
| *G03H 1/02* | (2006.01) |

(52) U.S. Cl.
CPC ............ *C08F 290/067* (2013.01); *C08F 2/50* (2013.01); *C08F 20/18* (2013.01); *C08G 18/10* (2013.01); *C08G 18/4241* (2013.01); *C08G 18/8108* (2013.01); *C08L 75/06* (2013.01); *C08L 75/12* (2013.01); *G03F 7/035* (2013.01); *G11B 7/083* (2013.01); *G11B 7/2535* (2013.01); *G03H 2001/0264* (2013.01); *G03H 2260/12* (2013.01)

(58) Field of Classification Search
CPC ........ C08F 290/067; C08F 2/50; C08F 20/18; C08G 18/10; C08G 18/4241; C08G 18/81; C08G 18/8108; C08L 75/06; G11B 7/083; G11B 7/2535; G03F 7/035; G03H 2001/0264; G03H 2260/12; G03H 2260/30
See application file for complete search history.

(56) References Cited

U.S. PATENT DOCUMENTS

| 2002/0086238 | A1* | 7/2002 | Fujimaki | ............... | B41C 1/1008 430/281.1 |
| 2004/0137334 | A1 | 7/2004 | Otaki et al. | | |
| 2006/0257782 | A1* | 11/2006 | Maemoto | .............. | B41C 1/1016 430/270.1 |
| 2008/0280228 | A1* | 11/2008 | Hayashi | ................ | B41C 1/1016 430/272.1 |
| 2008/0311482 | A1* | 12/2008 | Stockel | ................... | G11B 7/245 430/2 |
| 2010/0203241 | A1 | 8/2010 | Weiser et al. | | |
| 2010/0266936 | A1 | 10/2010 | Otaki et al. | | |
| 2011/0189591 | A1 | 8/2011 | Weiser et al. | | |
| 2011/0311906 | A1 | 12/2011 | Rölle et al. | | |
| 2012/0214089 | A1* | 8/2012 | Honel | ................. | G11B 7/24044 430/2 |
| 2012/0219883 | A1* | 8/2012 | Bruder | ............... | G11B 7/24044 430/2 |
| 2012/0219884 | A1 | 8/2012 | Weiser et al. | | |
| 2012/0231377 | A1* | 9/2012 | Weiser | ................... | C08G 18/44 430/2 |
| 2014/0038084 | A1 | 2/2014 | Hönel et al. | | |
| 2016/0320695 | A1* | 11/2016 | Rolle | ....................... | G03H 1/02 |
| 2018/0002463 | A1 | 1/2018 | Lee et al. | | |

FOREIGN PATENT DOCUMENTS

| CN | 101679574 A | 3/2010 |
| CN | 102667935 A | 9/2012 |
| CN | 107207909 A | 9/2017 |

(Continued)

OTHER PUBLICATIONS

International Search Report Issue for International Application No. PCT/KR2018/015470 dated Mar. 26, 2019, 4 pages.

*Primary Examiner* — Martin J Angebranndt
(74) *Attorney, Agent, or Firm* — Rothwell, Figg, Ernst & Manbeck, P.C.

(57) ABSTRACT

The present disclosure is to provide a photopolymer composition including a polymer matrix or a precursor thereof including a reaction product of a reactive isocyanate compound having a hydrogen bonding functional group capable of forming multiple hydrogen bonds and at least one isocyanate group, and a polyol having at least two hydroxyl groups; a photoreactive monomer; and a photoinitiator, a hologram recording medium produced from the photopolymer composition, an optical element including the photopolymer composition and a holographic recording method using the photopolymer composition.

15 Claims, No Drawings

(56) References Cited

FOREIGN PATENT DOCUMENTS

| | | | |
|---|---|---|---|
| EP | 2354845 B1 * | 12/2015 | ........... C07C 271/48 |
| JP | 2003-302726 A | 10/2003 | |
| JP | 2009-031588 A | 2/2009 | |
| JP | 4344177 B2 | 10/2009 | |
| JP | 2010-209319 A | 9/2010 | |
| JP | 2013-510333 A | 3/2013 | |
| JP | 2013-130847 A | 7/2013 | |
| KR | 10-2010-0092391 A | 8/2010 | |
| KR | 10-2011-0123242 A | 11/2011 | |
| KR | 10-2013-0126908 A | 11/2013 | |
| KR | 10-2014-0110895 A | 9/2014 | |
| KR | 10-2016-0095641 A | 8/2016 | |
| KR | 10-2017-0034453 A | 3/2017 | |
| WO | WO-03064489 A1 * | 8/2003 | |
| WO | WO-2016126102 A1 * | 8/2016 | .............. C08F 20/06 |

* cited by examiner

PHOTOPOLYMER COMPOSITION

CROSS-REFERENCE TO RELATED APPLICATION

This application is a 35 U.S.C. 371 National Phase Entry Application from PCT/KR2018/015470, filed on Dec. 7, 2018, designating the United States and which claims the benefits of Korean Patent Application No. 10-2017-0169488 filed on Dec. 11, 2017 with the Korean Intellectual Property Office, the disclosures of which are incorporated herein by reference in their entirety.

TECHNICAL FIELD

The present disclosure relates to a photopolymer composition, a hologram recording medium, an optical element and a holographic recording method.

BACKGROUND OF THE INVENTION

Hologram recording medium records information by changing a refractive index in the holographic recording layer in the medium through an exposure process, reads the variation of refractive index in the medium thus recorded, and reproduces the information.

When a photopolymer (photosensitive resin) is used, the light interference pattern can be easily stored as a hologram by photopolymerization of the low molecular weight monomer. Therefore, the photopolymer can be used in various fields such as optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

Typically, a photopolymer composition for hologram production comprises a polymer binder, a monomer, and a photoinitiator, and the photosensitive film produced from such a composition is irradiated with laser interference light to induce photopolymerization of local monomers.

In a portion where a relatively large number of monomers are present in such photopolymerization process, the refractive index becomes high. And in a portion where a relatively large number of polymer binders are present, the refractive index is relatively lowered and thus the refractive index modulation occurs, and a diffraction grating is generated by such refractive index modulation.

The refractive index modulation value (n) is influenced by the thickness and the diffraction efficiency (DE) of the photopolymer layer, and the angular selectivity increases as the thickness decreases.

Recently, development of materials capable of maintaining a stable hologram with a high diffraction efficiency has been demanded, and also various attempts have been made to manufacture a photopolymer layer having a thin thickness and a high refractive index modulation value.

BRIEF DESCRIPTION OF THE INVENTION

The present disclosure is to provide a photopolymer composition which can more easily provide a photopolymer layer having a high refractive index modulation value and a high diffraction efficiency even with a thin thickness.

The present disclosure is also to provide a hologram recording medium including a photopolymer layer having a high refractive index modulation value and a high diffraction efficiency even with a thin thickness.

The present disclosure is also to provide an optical element including the above-described hologram recording medium.

The present disclosure is also to provide a holographic recording method including selectively polymerizing photoreactive monomers contained in the photopolymer composition using an electromagnetic radiation.

The present disclosure provides a photopolymer composition including a polymer matrix or a precursor thereof including a reaction product of a reactive isocyanate compound having a hydrogen bonding functional group capable of forming multiple hydrogen bonds and at least one isocyanate group, and a polyol having at least two hydroxyl groups; a photoreactive monomer; and a photoinitiator.

The present disclosure also provides a hologram recording medium produced from the photopolymer composition.

In addition, the present disclosure provides an optical element including the hologram recording medium.

The present disclosure also provides a holographic recording method including selectively polymerizing photoreactive monomers contained in the photopolymer composition using a coherent light source.

DETAILED DESCRIPTION OF THE INVENTION

Hereinafter, the photopolymer composition, the hologram recording medium, the optical element, and the holographic recording method according to a specific embodiment of the present invention will be described in more detail.

As used herein, the term "(meth)acrylate" refers to either methacrylate or acrylate.

As used herein, the term "(co)polymer" refers to either a homopolymer or copolymer (including random copolymers, block copolymers, and graft copolymers).

Further, the term "hologram" as used herein refers to a recording medium in which optical information is recorded in an entire visible range and a near ultraviolet range (300 to 800 nm) through an exposure process, and examples thereof include all of visual holograms such as in-line (Gabor) holograms, off-axis holograms, full-aperture transfer holograms, white light transmission holograms ("rainbow holograms"), Denisyuk holograms, off-axis reflection holograms, edge-lit holograms or holographic stereograms.

In the present disclosure, the alkyl group may be linear or branched, and the number of carbon atoms is not particularly limited, but is preferably 1 to 40.

According to one embodiment, the alkyl group has 1 to 20 carbon atoms.

According to another embodiment, the alkyl group has 1 to 10 carbon atoms.

According to another embodiment, the alkyl group has 1 to 6 carbon atoms.

Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cycloheptylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present disclosure, the alkylene group is a divalent functional group derived from alkane, and may be linear, branched, or cyclic. Specific examples thereof include a methylene group, an ethylene group, a propylene group, an isobutylene group, a sec-butylene group, a tert-butylene group, a pentylene group, a hexylene group, and the like.

In the present disclosure, "*" refers to a bond connected to another substituent.

According to an embodiment of the present disclosure, provided is a photopolymer composition, including a polymer matrix or a precursor thereof including a reaction product of a reactive isocyanate compound having a hydrogen bonding functional group capable of forming multiple hydrogen bonds and at least one isocyanate group, and a polyol having at least two hydroxyl groups; a photoreactive monomer; and a photoinitiator.

The present inventors have found through experiments that holograms formed from the photopolymer composition including a polymer matrix or a precursor thereof including a reaction product of a reactive isocyanate compound having a hydrogen bonding functional group capable of forming multiple hydrogen bonds and at least one isocyanate group, and a polyol having at least two hydroxyl groups can exhibit a high refractive index modulation value and a high diffraction efficiency even with a thin thickness, thereby completing the present invention.

More specifically, due to structural stability of the polymer matrix or the precursor thereof, shrinkage does not significantly occur during the formation of the hologram, thereby preventing distortion of the hologram. In addition, the polymer matrix or the precursor thereof has a network structure composed of non-covalent bonds such as a hydrogen bond, so that the network structure can be reformed by intermolecular interaction when external impact is applied thereto, thereby improving durability against the external impact.

The polymer matrix or the precursor thereof including a reaction product of a reactive isocyanate compound having a hydrogen bonding functional group capable of forming multiple hydrogen bonds and at least one isocyanate group, and a polyol having at least two hydroxyl groups has an urethane bond formed by the reaction of the isocyanate group and the hydroxyl group of the polyol, thereby exhibiting excellent flexibility of the formed matrix. Therefore, it is possible to improve mobility of the photoreactive monomer in the finally produced hologram recording medium, and it has high compatibility with other components, so that the formed hologram has excellent durability.

Also, the hydrogen bonding functional group capable of forming multiple hydrogen bonds can form a hydrogen bond in the polymer matrix, and the degree of cross-linking may be controlled. Accordingly, as described above, when external impact is applied after a cross-linked structure is formed by non-covalent bonding such as hydrogen bonding, the cross-linking structure can be reformed in a repetitive and reversible form by intermolecular interaction, thereby improving durability of the finally produced hologram and mechanical properties of the film on which the hologram is formed.

The hydrogen bonds in the polymer matrix are relatively weak bonds with Gibb's free energy ($\Delta G$) of about $-12$ to $-24$ Kcal/mol, but may have a strong bonding force by arranging a plurality of hydrogen bonding donors and acceptors. Therefore, the polymer matrix of the embodiment can have properties similar to those of a polymer matrix using chemical cross-linking by covalent bonding.

The polymer matrix or the precursor thereof may serve as a support for the hologram recording medium and a final product produced therefrom, and the photoreactive monomer may serve as a recording monomer. When these are used, the photoreactive monomer is selectively polymerized on the polymer matrix during holographic recording, resulting in refractive index modulation due to a difference in the refractive index.

In addition, the refractive index of the polymer matrix is not particularly limited, but may be 1.45 to 1.70, 1.455 to 1.60, or 1.46 to 1.53.

Specific examples of the hydrogen bonding functional group capable of forming multiple hydrogen bonds include a monovalent functional group selected from the group consisting of —OH, —OR, —NH$_2$, —NHR (wherein R is a C1 to C20 aliphatic group), —NR$_2$ (wherein R is a C1 to C20 aliphatic group), —COOH, —COOR (wherein R is a C1 to C20 aliphatic group), —CONH$_2$, —CONR$_2$, —NHOH, and —NROR (wherein R is a C1 to C20 aliphatic group), or a divalent functional group selected from the group consisting of —NHCO—, —NR'CO—, —O—, —NH—, —NR'—, —COO—, —CONHCO—, —CONR'CO—, —NH—NH—, —NR'—NH—, and —NR'—NR'—.

The R' may be a C1 to C20 aliphatic group, a C4 to C20 alicyclic group, or a C6 to C20 aromatic group.

The specific structure of the reactive isocyanate compound having a hydrogen bonding functional group capable of forming multiple hydrogen bonds and at least one isocyanate group is not particularly limited, but may have a structure in which a heterocyclic compound having a hydrogen bonding functional group capable of forming multiple hydrogen bonds; and an aliphatic, alicyclic or aromatic compound having at least one isocyanate group; are bonded.

The reactive isocyanate compound may be formed by reacting a heterocyclic compound having a hydrogen bonding functional group capable of forming multiple hydrogen bonds; and an aliphatic, alicyclic or aromatic compound having at least one isocyanate group, or by reacting precursor compounds capable of forming the above-described structure.

For example, the reactive isocyanate compound having the above-described structure may be synthesized by reacting a predetermined heterocyclic compound with an aliphatic, alicyclic or aromatic compound having at least two isocyanate groups.

Specifically, the heterocyclic compound having a hydrogen bonding functional group capable of forming multiple hydrogen bonds may be at least one selected from the group consisting of 2-ureido-4-pyrimidinone, 2-ureido-4-pyrimidinol, 2-uriedo-4-pyrimidone, diacylpyrimidine, 2,6-di(acetylamino)-4-pyridyl, 2,7-diamino-1,8-naphthyridine, adenine, thymine, uracil, guanine, cytosine, adenine-thymine dimer, adenine-uracil dimer, and guanine-cytosine dimer.

In addition, the aliphatic, alicyclic or aromatic compound having at least one isocyanate group may be a C1 to C20 aliphatic compound having at least one isocyanate group, a C4 to C20 alicyclic compound having at least one isocyanate group and substituted with at least one C1 to C10 aliphatic group, or a C6 to C20 aromatic compound having at least one isocyanate group and substituted with at least one C1 to C10 aliphatic group.

More specifically, the compound having at least one isocyanate group is an aliphatic, cycloaliphatic, aromatic or aromatic-aliphatic mono-, di-, tri- or poly-isocyanate.

The compound having at least one isocyanate group may be secondary products with relatively high molecular weight (oligo- and poly-isocyanates) of monomer-type di- and/or tri-isocyanates having urethane, urea, carbodiimide, acylurea, isocyanurate, allophanate, biuret, oxadiazinetrione, uretdione or iminooxadiazinedione structures.

Specific examples of the compound having at least one isocyanate group include butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, isomeric bis(4,4'-isocyanato-cyclohexyl)methane, a mixture thereof with any desired isomer content, isocyanatomethyl-1,8-octane diisocyanate, 1,4-cyclohexylene diisocyanate, isomeric cyclohexane dimethylene diisocyanate, 1,4-phenylene diisocyanate, 2,4- and/or 2,6-toluene diisocyanate, 1,5-naphthylene diisocyanate, 2,4'- or 4,4'-diphenylmethane diisocyanate and/or triphenylmethane 4,4',4"-triisocyanate or the like.

Meanwhile, the polyol having at least two hydroxyl groups which react with the reactive isocyanate compound to form the polymer matrix may be an aliphatic, aromatic-aliphatic or cycloaliphatic diol, triol and/or higher polyol having 2 to 20 carbon atoms.

The polyol may have a hydroxyl equivalent weight of 300 g/mol to 10,000 g/mol, and a weight average molecular weight of 100,000 to 1,500,0000 g/mol.

Examples of the diols include ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positional isomers of diethyloctanediols, 1,3-butylene glycol, cyclohexanediol, 1,4-cyclohexane-dimethanol, 1,6-hexanediol, 1,2- and 1,4-cyclohexanediol, hydrogenated bisphenol A (2,2-bis(4-hydroxycyclohexyl)propane) and 2,2-dimethyl-3-hydroxypropyl, and 2,2-dimethyl-3-hydroxypropionate.

Further, examples of the triols include trimethylolethane, trimethylolpropane or glycerol.

Suitable high-functional alcohols include ditrimethylolpropane, pentaerythritol, dipentaerythritol and sorbitol.

As the polyols, aliphatic and cycloaliphatic polyols having a relatively large molecular weight, such as polyester polyols, polyether polyols, polycarbonate polyols, hydroxy-functional acrylic resins, hydroxy-functional polyurethanes, hydroxy-functional epoxy resins and the like may be used.

The polyester polyols may be linear polyester diols, as obtained in a known manner from aliphatic, cycloaliphatic or aromatic di- or polycarboxylic acid or their anhydride, for example, succinic acid, glutaric acid, adipic acid, pimelic acid, suberic acid, azelaic acid, sebacic acid, nonanedicarboxylic acid, decanedicarboxylic acid, terephthalic acid, isophthalic acid, o-phthalic acid, tetrahydrophthalic acid, hexahydrophthalic acid or trimellitic acid, and acid anhydrides such as o-phthalic anhydride, trimellitic anhydride or succinic anhydride, or any mixtures thereof, by using polyhydric alcohols such as ethanediol, di-, tri- or tetraethylene glycol, 1,2-propanediol, di-, tri- or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, or a mixture thereof, and optionally, simultaneously using higher functional polyols such as trimethylol propane or glycerol.

Of course, cyclic aliphatic and/or aromatic di- and polyhydroxy compounds are suitable as polyhydric alcohols for the preparation of polyester polyols.

It is also possible to use the corresponding polycarboxylic acid anhydrides of the lower alcohols or the corresponding polycarboxylates, or mixtures thereof, instead of free polycarboxylic acids in the preparation of the polyesters.

Further, the polyester polyols that can be used in the synthesis of the polymer matrix include homo- or copolymers of lactones, which are preferably obtained by an addition of lactones or lactone mixtures, such as butyrolactone, ε-caprolactone and/or methyl-ε-caprolactone to suitable bifunctional and/or higher functional initiator molecules, such as the aforementioned polyhydric alcohols having a small molecular weight as the synthetic component for the polyester polyols.

Further, the polycarbonates having hydroxyl groups are also suitable as a polyhydroxy component for prepolymer synthesis. For example, it may be prepared by reaction of diols such as 1,4-butanediol and/or 1,6-hexanediol and/or 3-methylpentanediol with diaryl carbonates such as diphenyl carbonate, dimethyl carbonate or phosgene.

Further, the polyether polyol that can be used for the synthesis of the polymer matrix may be, for example, polyaddition products of styrene oxides, of ethylene oxide, of propylene oxide, of tetrahydrofuran, of butylene oxide, or of epichlorohydrin, mixed addition products thereof, grafting products thereof, polyether polyols obtained by condensation of polyhydric alcohols or mixtures thereof, and those obtained by alkoxylation of polyhydric alcohols, amines and amino alcohols.

Specific examples of the polyether polyol include poly (propylene oxide)s, poly(ethylene oxide)s and combinations thereof in the form of random or block copolymers, or poly(tetrahydrofuran)s and mixtures thereof having an OH functionality of 1.5 to 6 and a number average molecular weight of 200 to 18000 g/mol, preferably an OH functionality of 1.8 to 4.0 and a number average molecular weight of 600 to 8000 g/mol, particularly preferably an OH functionality of 1.9 to 3.1 and a number average molecular weight of 650 to 4500 g/mol.

In order to achieve a higher refractive index modulation value (Δn) and a diffraction efficiency from the photopolymer composition of the embodiment, a polyol having a hydroxyl equivalent weight of 1,000 g/mol to 3,000 g/mol, or 1,200 g/mol to 2,500 g/mol can be used as the polyol having at least two hydroxyl groups.

When using the polyol having a hydroxyl equivalent weight within the above-mentioned range, it is easier to control the degree of cross-linking and the cross-linking reactivity in the cross-linking reaction of a polymer matrix forming a urethane bond.

In addition, when using the polyol having a hydroxyl equivalent weight within the above-described range, a molar ratio of the reactive isocyanate compound having a hydrogen bonding functional group capable of forming multiple hydrogen bonds and at least one isocyanate group to the polyol having at least two hydroxyl groups may be 2 to 8, or 3 to 6.

Since the weight ratio of the reactive isocyanate compound to the polyol having at least two hydroxyl groups is within the above-described range, cross-linking density of the final polymer matrix can be controlled by adjusting a site ratio of cross-linking which is formed through a hydrogen bond. The glass transition temperature (Tg) of the polymer matrix and mobility of the recording monomer are changed according to the cross-linking density, and thus the refractive index modulation value (Δn) and the diffraction efficiency of the finally produced hologram recording medium can be greatly improved.

The photoreactive monomer may include a polyfunctional (meth)acrylate monomer or a monofunctional (meth)acrylate monomer.

As described above, in a portion where the monomer is polymerized in the process of photopolymerization of the photopolymer composition and the polymer is present in relatively large amounts, the refractive index becomes high. In a portion where the polymer binder is present in relatively large amounts, the refractive index becomes relatively low, the refractive index modulation occurs, and a diffraction grating is generated by such refractive index modulation.

Specifically, an example of the photoreactive monomer may include (meth)acrylate-based α,β-unsaturated carboxylic acid derivatives, for example, (meth)acrylate, (meth)acrylamide, (meth)acrylonitrile, (meth)acrylic acid or the like, or a compound containing a vinyl group or a thiol group.

An example of the photoreactive monomer may include a polyfunctional (meth)acrylate monomer having a refractive index of 1.5 or more, 1.53 or more, or 1.5 to 1.7. The polyfunctional (meth)acrylate monomer having a refractive index of 1.5 or more, 1.53 or more, or 1.5 to 1.7 may include a halogen atom (bromine, iodine, etc.), sulfur (S), phosphorus (P), or an aromatic ring.

More specific examples of the polyfunctional (meth)acrylate monomer having a refractive index of 1.5 or more include bisphenol A modified diacrylate type, fluorene acrylate type (HR6022 etc. manufactured by Miwon Specialty Chemical Co., Ltd.), bisphenol fluorene epoxy acrylate type (HR6100, HR6060, HR6042, ect. manufactured by Miwon Specialty Chemical Co., Ltd.), halogenated epoxy acrylate type (HR1139, HR3362, etc. manufactured by Miwon Specialty Chemical Co., Ltd.), and the like.

Another example of the photoreactive monomer may include a monofunctional (meth)acrylate monomer.

The monofunctional (meth)acrylate monomer may contain an ether bond and a fluorene functional group in the molecule. Specific examples thereof include phenoxybenzyl (meth)acrylate, o-phenylphenol ethylene oxide (meth)acrylate, benzyl (meth)acrylate, 2-(phenylthio)ethyl (meth)acrylate, biphenylmethyl (meth)acrylate, or the like.

Meanwhile, the photoreactive monomer may have a weight average molecular weight of 50 g/mol to 1000 g/mol, or 200 g/mol to 600 g/mol.

The weight average molecular weight refers to a weight average molecular weight using polystyrene calibration measured by a GPC method.

In the process of measuring the weight average molecular weight using polystyrene calibration measured by a GPC method, a well-known analyzer, detector such as a refractive index detector, and analyzing column may be used. In addition, conventionally applied temperature conditions, solvents, and flow rates may be used.

As a specific example of the measurement conditions, a temperature of 30° C., a chloroform solvent and a flow rate of 1 mL/min may be applied.

Meanwhile, the photopolymer composition of the embodiment includes a photoinitiator.

The photoinitiator is a compound which is activated by light or actinic radiation and initiates polymerization of a compound containing a photoreactive functional group such as the photoreactive monomer.

As the photoinitiator, commonly known photoinitiators can be used without particular limitation, but specific examples thereof include a photoradical polymerization initiator, a photocationic polymerization initiator and a photoanionic polymerization initiator.

Specific examples of the photoradical polymerization initiator include imidazole derivatives, bisimidazole derivatives, N-aryl glycine derivatives, organic azide compounds, titanocene, aluminate complex, organic peroxide, N-alkoxypyridinium salts, thioxanthone derivatives, amine derivatives, and the like.

More specifically, examples of the photoradical polymerization initiator include 1,3-di(t-butyldioxycarbonyl)benzophenone, 3,3',4,4"-tetrakis(t-butyldioxycarbonyl) benzophenone, 3-phenyl-5-isoxazolone, 2-mercapto benzimidazole, bis(2,4,5-triphenyl)imidazole, 2,2-dimethoxy-1,2-diphenylethane-1-one (product name: Irgacure 651/manufacturer: BASF), 1-hydroxy-cyclohexyl-phenyl-ketone (product name: Irgacure 184/manufacturer: BASF), 2-benzyl-2-dimethylamino-1-(4-morpholinophenyl)-butanone-1 (product name: Irgacure 369/manufacturer: BASF), bis(η5-2,4-cyclopentadiene-1-yl)-bis(2,6-difluoro-3-(1H-pyrrole-1-yl)-phenyl)titanium (product name: Irgacure/784 manufacturer: BASF), Ebecryl P-115 (manufacturer: SK entis), H-Nu 254 (manufacturer: Spectra Group Limited), and the like.

The photocationic polymerization initiator may include a diazonium salt, a sulfonium salt, or an iodonium salt, and examples thereof include sulfonic acid esters, imidosulfonates, dialkyl-4-hydroxysulfonium salts, arylsulfonic acid-p-nitrobenzyl esters, silanol-aluminum complexes, (η6-benzene) (η5-cyclopentadienyl)iron (II), and the like.

In addition, benzoin tosylate, 2,5-dinitrobenzyltosylate, N-tosylphthalic acid imide, and the like can be used.

More specific examples of the photocationic polymerization initiator include commercially available products such as Cyracure UVI-6970, Cyracure UVI-6974 and Cyracure UVI-6990 (manufacturer: Dow Chemical Co. in USA), Irgacure 264 and Irgacure 250 (manufacturer: BASF) or CIT-1682 (manufacturer: Nippon Soda).

The photoanionic polymerization initiator may include a borate salt, and examples thereof include butyryl chlorine butyltriphenyl borate.

More specific examples of the photoanionic polymerization initiator include commercially available products such as borate V (manufacturer: Spectra group).

In addition, the photopolymer composition of the embodiment may include a monomolecular (type I) initiator or a bimolecular (type II) initiator.

The (type I) system for free radical photopolymerization may include, for example, an aromatic ketone compounds in combination with a tertiary amine, such as benzophenone, alkylbenzophenone, 4,4'-bis(dimethylamino)benzophenone (Michler's ketone), anthrone and halogenated benzophenone or a mixture of these types.

The bimolecular (type II) initiator may include benzoin and derivatives thereof, benzyl ketal, acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha, alpha-dialkoxyacetophenone, 1-[4-(phenylthio)phenyl]octane-1,2-dione 2-(O-benzoyloxime), alpha-hydroxyalkylphenone, and the like.

The photopolymer composition may include 1 wt % to 80 wt % of the polymer matrix or the precursor thereof; 5 wt % to 80 wt % of the cross-linking agent having a reactive functional group; 5 wt % to 80 wt % of the photoreactive monomer; and 0.1 wt % to 15 wt % of the photoinitiator. When the photopolymer composition further includes an organic solvent as described hereinafter, the content of the above-mentioned components is based on the sum of the above-mentioned components (the sum of the components excluding the organic solvent).

The photopolymer composition may further include a low refractive fluorine-based compound.

The fluorine-based compound is stable with little reactivity and has a low refractive index. Therefore, the refractive index of the polymer matrix may be lowered when the fluorine-based compound is added into the photopolymer composition, thereby maximizing the refractive index modulation with the monomer.

The low refractive fluorine-based compound may include at least one functional group selected from the group consisting of an ether group, an ester group and an amide group, and at least two difluoromethylene groups.

More specifically, the fluorine-based compound may have a structure represented by the following Chemical Formula 4 in which a functional group including an ether group is bonded to both terminal ends of a central functional group including a direct bond between two difluoromethylene groups or an ether bond.

[Chemical Formula 4]

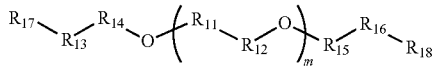

In Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, and $R_{17}$ and $R_{18}$ are each independently a polyalkylene oxide, and m is an integer of 1 or more, 1 to 10, or 1 to 3.

Preferably in Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently a 2-methoxyethoxymethoxy group, and m is an integer of 2.

The low refractive fluorine-based compound may have a refractive index of less than 1.45, or 1.4 or more and less than 1.45.

As described above, since the photoreactive monomer has a refractive index of 1.5 or more which is higher than that of the low refractive fluorine-based compound, the refractive index of the polymer matrix may be lowered, thereby maximizing the refractive index modulation with the monomer.

Specifically, the low refractive fluorine-based compound content may be 30 to 150 parts by weight, or 50 to 110 parts by weight based on 100 parts by weight of the photoreactive monomer.

When the low refractive fluorine-based compound content is excessively decreased based on 100 parts by weight of the photoreactive monomer, the refractive index modulation value after recording may be lowered due to a lack of low refractive components. When the content is excessively increased, films may not be formed due to a low degree of cross-linking or a defect rate may be increased due to low compatibility. Also, haze may be generated due to poor compatibility with other components or some fluorine-based compounds may be eluted to the surface of the coating layer.

The low refractive fluorine-based compound may have a weight average molecular weight (measured by GPC) of 300 or more, or 300 to 1000.

A specific method of measuring the weight average molecular weight is as described above.

Meanwhile, the photopolymer composition may further include a photosensitizing dye.

The photosensitizing dye serves as a photosensitizing pigment to sensitize the photoinitiator. More specifically, the photosensitizing dye may be stimulated by the light irradiated on the photopolymer composition and may also serve as an initiator to initiate polymerization of the monomer and the cross-linking monomer.

The photopolymer composition may contain 0.01 wt % to 30 wt %, or 0.05 wt % to 20 wt % of the photosensitizing dye.

Examples of the photosensitizing dye are not particularly limited, and various compounds commonly known in the art can be used.

Specific examples of the photosensitizing dye include sulfonium derivative of ceramidonine, new methylene blue, thioerythrosine triethylammonium, 6-acetylamino-2-methylceramidonin, eosin, erythrosine, rose bengal, thionine, basic yellow, Pinacyanol chloride, Rhodamine 6G, Gallocyanine, ethyl violet, Victoria blue R, Celestine blue, QuinaldineRed, Crystal Violet, Brilliant Green, Astrazon orange G, Darrow Red, Pyronin Y, Basic Red 29, pyrylium iodide, Safranin O, Cyanine, Methylene Blue, Azure A, or a combination of two or more thereof.

The photopolymer composition may further include an organic solvent.

Examples of the organic solvent include ketones, alcohols, acetates, ethers, and a mixture of two or more thereof.

Specific examples of the organic solvent include ketones such as methyl ethyl ketone, methyl isobutyl ketone, acetylacetone or isobutyl ketone; alcohols such as methanol, ethanol, n-propanol, i-propanol, n-butanol, i-butanol or t-butanol; acetates such as ethyl acetate, i-propyl acetate, or polyethylene glycol monomethyl ether acetate; ethers such as tetrahydrofuran or propylene glycol monomethyl ether; or a mixture of two or more thereof.

The organic solvent may be added at the time of mixing the respective components contained in the photopolymer composition, or may be contained in the photopolymer composition by adding the respective components dispersed or mixed in an organic solvent.

When the content of the organic solvent in the photopolymer composition is too low, flowability of the photopolymer composition may be lowered, resulting in the occurrence of defects such as striped patterns on the finally produced film.

In addition, when too much organic solvent is added, the solid content is lowered, and coating and film formation are not sufficient, so that physical properties and surface characteristics of the film may be deteriorated and defects may occur during the drying and curing process.

Thus, the photopolymer composition may include an organic solvent such that the total solid content concentration of the components contained is 1 wt % to 70 wt %, or 2 wt % to 50 wt %.

The photopolymer composition may further include other additives, catalysts, and the like.

For example, the photopolymer composition may further include a catalyst which is commonly known for promoting polymerization of the polymer matrix or the photoreactive monomer.

Examples of the catalyst include tin octanoate, zinc octanoate, dibutyltin dilaurate, dimethylbis[(1-oxoneodecyl)oxy]stannane, dimethyltin dicarboxylate, zirconium bis(ethylhexanoate), zirconium acetylacetonate, p-toluenesulfonic acid, or tertiary amines such as 1,4-diazabicyclo[2.2.2]octane, diazabicyclononane, diazabicyclo undecane, 1,1,3,3-tetramethylguanidine, 1,3,4,6,7,8-hexahydro-1-methyl-2H-pyrimido(1,2-a)pyrimidine, and the like.

Examples of the other additives include a defoaming agent or a phosphate-based plasticizer, and the defoaming agent may be a silicone-based reactive additive, for example, Tego Rad 2500.

Examples of the plasticizer include phosphate compounds such as tributyl phosphate, and the plasticizer may be added in a weight ratio of 1:5 to 5:1 together with the fluorine-based compound.

The plasticizer may have a refractive index of less than 1.5 and a molecular weight of 700 or less.

The fluorine-based compound or the phosphate-based compound has a lower refractive index than the photoreactive monomer, thereby lowering the refractive index of the polymer matrix and maximizing the refractive index modulation of the photopolymer composition.

Moreover, the phosphate-based compound serves as a plasticizer to lower the glass transition temperature of the polymer matrix, thereby improving moldability of the photopolymer composition or increasing mobility of the monomer.

The photopolymer composition can be used for hologram recording.

Meanwhile, according to another embodiment of the present disclosure, a hologram recording medium produced from the photopolymer composition may be provided.

As described above, when the photopolymer composition of one embodiment is used, it is possible to provide holograms capable of achieving a significantly improved refractive index modulation value and a high diffraction efficiency while having a thinner thickness, as compared with holograms previously known in the art.

The hologram recording medium can realize a refractive index modulation value (n) of 0.008 or more, 0.010 or more, 0.011 or more, or 0.012 or more even at a thickness of 5 μm to 30 μm. The upper limit is not particularly limited, but may be 0.020 or less.

Further, the hologram recording medium may have a diffraction efficiency of 50% or more, 70% or more, 80% or more, or 85% or more at a thickness of 5 μm to 30 μm. The upper limit is not particularly limited, but may be 99.9% or less.

In the photopolymer composition of the one embodiment, the respective components contained therein are homogeneously mixed, dried and cured at a temperature of 20° C. or higher, and then predetermined exposure procedures are undertaken, thereby producing a hologram for optical application in the entire visible range and the near ultraviolet region (300 to 800 nm).

In the photopolymer composition of the one embodiment, the components for forming the polymer matrix or the precursor thereof may be first homogeneously mixed, and then the linear silane cross-linking agent may be mixed with the catalyst to prepare holograms.

In the photopolymer composition of one embodiment, a mixing device, a stirrer, a mixer, or the like which are commonly used in the art can be used for mixing the respective components contained therein without particular limitation. The temperature in the mixing process may be 0° C. to 100° C., preferably 10° C. to 80° C., particularly preferably 20° C. to 60° C.

Meanwhile, the components for forming the polymer matrix or the precursor thereof in the photopolymer composition of one embodiment are first homogenized and mixed. Subsequently, at the time of adding the linear silane cross-linking agent, the photopolymer composition may become a liquid formulation that is cured at a temperature of 20° C. or more.

The curing temperature may vary depending on the composition of the photopolymer and the curing is promoted, for example, by heating at a temperature of from 30° C. to 180° C.

At the time of curing, the photopolymer may be in state of being injected into or coated onto a predetermined substrate or mold.

Meanwhile, as the method of recording a visual hologram on a hologram recording medium produced from the photopolymer composition, generally known methods can be used without particular limitation. The method described in the holographic recording method of the embodiment described hereinafter can be adopted as an example.

According to another embodiment of the present disclosure, a holographic recording method may be provided, which includes selectively polymerizing photoreactive monomers contained in the photopolymer composition using a coherent light source.

As described above, through the process of mixing and curing the photopolymer composition, it is possible to produce a medium in which no visual hologram is recorded, and a visual hologram can be recorded on the medium through a predetermined exposure process.

A visual hologram can be recorded on the media provided through the process of mixing and curing the photopolymer composition, using known devices and methods under commonly known conditions.

According to another embodiment of the present disclosure, an optical element including the hologram recording medium may be provided.

Specific examples of the optical element include optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

An example of the optical element including the hologram recording medium may include a hologram display device.

The hologram display device includes a light source unit, an input unit, an optical system, and a display unit.

The light source unit is a part that irradiates a laser beam used for providing, recording, and reproducing three-dimensional image information of an object in the input unit and the display unit.

Further, the input unit is a part that previously inputs three-dimensional image information of an object to be recorded on the display unit, and for example, three-dimensional information of an object such as the intensity and phase of light for each space can be input into an electrically addressed liquid crystal SLM, wherein an input beam may be used.

The optical system may include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

The display unit can receive three-dimensional image information of an object from an input unit, record it on a hologram plate composed of an optically addressed SLM, and reproduce the three-dimensional image of the object.

Herein, the three-dimensional image information of the object can be recorded via interference of the input beam and the reference beam.

The three-dimensional image information of the object recorded on the hologram plate can be reproduced into a three-dimensional image by the diffraction pattern generated by the reading beam. The erasing beam can be used to quickly remove the formed diffraction pattern.

Meanwhile, the hologram plate can be moved between a position at which a three-dimensional image is input and a position at which a three-dimensional image is reproduced.

Advantageous Effects

According to the present disclosure, provided are a photopolymer composition which can achieve a high refractive index modulation value and a high diffraction efficiency even with a thin thickness, a hologram recording medium using the same, an optical element and a holographic recording method.

DETAILED DESCRIPTION OF THE EMBODIMENTS

Hereinafter, the present invention will be explained in detail with reference to the following examples.

However, these examples are only to illustrate the invention, and the scope of the invention is not limited thereto.

PREPARATION EXAMPLES

1. Preparation Example 1: Synthesis of Reactive Isocyanate Compound 4.4 g (0.7 mol) of 2-amino-6-methylpyrimidin-4-ol was dissolved in 39 g (3.5 mol) of isophorone diisocyanate in a 500 ml flask, and then refluxed at 90° C. for 40 hours.

When the mixture turned transparent, work-up was carried out by slowly precipitating the mixture in an excess of n-hexane, followed by filtering and drying to obtain a product in a yield of 30%.

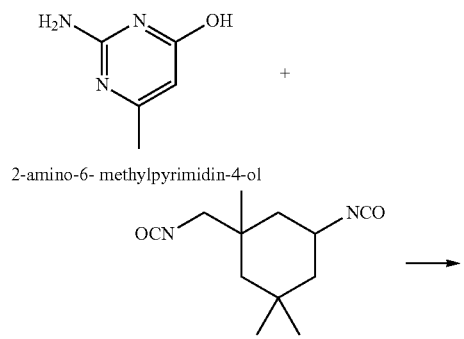

2-amino-6- methylpyrimidin-4-ol

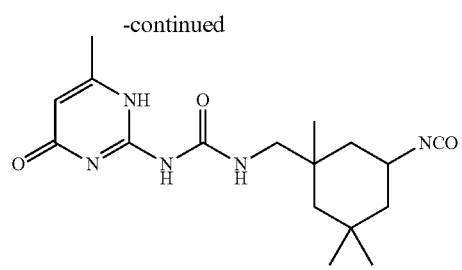

Preparation Example 2: Preparation of Non-Reactive Low Refractive Material (P2)

20.51 g of 2,2'-((oxybis(1,1,2,2-tetrafluoroethane-2,1-diyl))bis(oxy))bis(2,2-difluoroethan-1-ol was placed in a 1000 ml flask, dissolved in 500 g of tetrahydrofuran, and 4.40 g of sodium hydride (60% dispersion in mineral oil) was gently added several times while stirring at 0° C.

After stirring at 0° C. for 20 minutes, 12.50 ml of 2-methoxyethoxymethyl chloride was slowly dropped.

When all of the reactants were confirmed to be consumed by $^1$H NMR, the reaction solvent was completely removed under reduced pressure.

The organic layer was collected by extracting three times with 300 g of dichloromethane. Thereafter, it was filtered with magnesium sulfate, and all dichloromethane was removed under reduced pressure to obtain 29 g of a liquid product having a purity of 95% or more at a yield of 98%.

EXAMPLES: PREPARATION OF PHOTOPOLYMER COMPOSITION

Example 1

As shown in Table 1 below, 0.25 g of the reactive isocyanate compound obtained in Preparation Example 1, 41.3 g of polyol-1 (Acrylic polyol, OH equivalent weight of 5767 g/mol, diluted to 20% solids), 8.5 g of the photoreactive monomer (high refractive acrylate, refractive index of 1.600, HR6022, manufactured by Miwon), 3.7 g of tributyl phosphate (TBP, molecular weight of 266.31, refractive index of 1.424, manufactured by Sigma-Aldrichch), and 3.7 g of P2 (non-reactive low refractive material) obtained in Preparation Example 2 were mixed with 30 g of MIBK (solvent), and stirred for 1 hour to obtain a transparent solution.

Subsequently, 4.9 g of safranin O (dye, manufactured by Sigma-Aldrich), 3.7 g of tertiary amine (CN-386, manufactured by Sartomer, diluted to 10% solids) and 2.5 g of Irgacure 250 (diluted to 1% solids) were added thereto, and then mixed and uniformly stirred for 30 minutes. Thereafter, 1.6 g of DBTDL (dibutyltin dilaurate, diluted to 1% solids) was added and stirred for 1 minute to prepare a transparent photopolymer coating solution.

The photopolymer coating solution was coated on a TAC substrate (80 μm) using a meyer bar, and then thermally cured at 40° C. for 30 minutes to prepare a photopolymer coating film having a coating layer with a thickness of 15 μm.

Examples 2 to 7

A photopolymer coating solution and a photopolymer coating film were prepared in the same manner as in Example 1, except that polyol-2 (Acrylic polyol, OH equivalent weight of 1,800 g/mol, diluted to 20% solids) was used and the contents of other components were changed as shown in Table 2.

EXPERIMENTAL EXAMPLES: HOLOGRAPHIC RECORDING (1) The photopolymer-coated surfaces prepared in each of Examples and Comparative Examples were laminated on a slide glass, and fixed so that a laser first passed through the glass surface at the time of recording.

(2) Measurement of Diffraction Efficiency ($\eta$)

A holographic recording was done via interference of two interference lights (reference light and object light), and a transmission-type recording was done so that the two beams were incident on the same side of the sample.

The diffraction efficiencies change with the incident angle of the two beams, and become non-slanted when the incident angles of the two beams are the same.

In the non-slanted recording, the diffraction grating is generated perpendicularly to the film because the incident angles of the two beams are equal to a normal line.

The recording ($2\theta=45°$) was done in a transmission-type non-slanted manner using a laser with a wavelength of 532 nm, and the diffraction efficiency ($\eta$) was calculated according to the following Equation 1.

$$\eta = \frac{P_D}{P_D + P_T} \quad \text{[Equation 1]}$$

In Equation 1, $\eta$ is a diffraction efficiency, $P_D$ is an output amount (mW/cm$^2$) of the diffracted beam of a sample after recording, and $P_T$ is an output amount (mW/cm$^2$) of the transmitted beam of the recorded sample.

(3) Measurement of Refractive Index Modulation Value ($\Delta n$)

The lossless dielectric grating of the transmission-type hologram can calculate the refractive index modulation value ($\Delta n$) from the following Equation 2.

$$\eta(DE) = \sin^2\left(\sqrt{v^2}\right) = \sin^2\left(\frac{\pi \Delta n d}{\lambda \cos\theta}\right) \quad \text{[Equation 2]}$$

In Equation 2, d is a thickness of the photopolymer layer, $\Delta n$ is a refractive index modulation value, $\eta(DE)$ is a diffraction efficiency, and $\lambda$ is a recording wavelength.

TABLE 2

Measurement results of Experimental Examples of the holographic recording medium prepared from Examples

| | Diffraction efficiency ($\eta$)(%) | Refractive index modulation value ($\Delta n$) |
|---|---|---|
| Ex. 1 | 77 | 0.01 |
| Ex. 2 | 61 | 0.008 |
| Ex. 3 | 52 | 0.0112 |
| Ex. 4 | 65 | 0.0125 |
| Ex. 5 | 97 | 0.02 |
| Ex. 6 | 95 | 0.019 |
| Ex. 7 | 85 | 0.016 |

As shown in Tables 1 and 2 above, it was confirmed that the photopolymer coating films of Examples prepared by using a reaction product of the reactive isocyanate compound of Preparation Example 1 which has a hydrogen bonding functional group capable of forming multiple hydrogen bonds and at least one isocyanate group and the polyol having at least two hydroxyl groups had a refractive index modulation value ($\Delta n$) of 0.008 or more and a diffraction efficiency of 50% or more.

Particularly, it was confirmed that Examples 5 and 6 including a polymer matrix prepared by using the polyol having a predetermined hydroxyl equivalent weight and the reactive isocyanate compound in a molar ratio of 3 to 6 had a refractive index modulation value ($\Delta n$) of 0.018 or more and a diffraction efficiency of 90% or more.

The invention claimed is:

1. A photopolymer composition, comprising:
   a polymer matrix or a precursor thereof including a reaction product of a reactive isocyanate compound having a hydrogen bonding functional group capable of forming multiple hydrogen bonds and at least one isocyanate group, and a polyol having at least two hydroxyl groups;
   a photoreactive monomer; and
   a photoinitiator,
   wherein the reactive isocyanate compound has a structure in which a heterocyclic compound having a hydrogen bonding functional group capable of forming multiple hydrogen bonds; and an alicyclic or aromatic compound having at least one isocyanate group are bonded, and
   wherein the heterocyclic compound having a hydrogen bonding functional group capable of forming multiple hydrogen bonds is at least one selected from the group consisting of 2-ureido-4-pyrimidinone, 2-ureido-4-pyrimidinol, 2-amino-6-methylpyrimidin-4-ol, diacylpy-

TABLE 1

The photopolymer compositions of Examples (unit: g)

| | Reactive isocyanate compound (content: g) | Polyol-1 (Solids content: 20%) | Polyol-2 (Solids content: 20%) | HR6042 | Safranine O (Solids content: 0.5%) | CN-386 (Solids content: 10%) | Irgacure 250 (Solids content: 1%) | TBP | P2 | DBTDL (Solids content: 1%) | MIBK |
|---|---|---|---|---|---|---|---|---|---|---|---|
| Ex. 1 | 0.25 | 41.3 | | 8.5 | 4.9 | 3.7 | 2.5 | 3.7 | 3.7 | 1.6 | 30 |
| Ex. 2 | 0.48 | | 40.1 | 8.5 | 4.9 | 3.7 | 2.5 | 3.7 | 3.7 | 1.6 | 30 |
| Ex. 3 | 0.47 | | 40.2 | 8.5 | 4.9 | 3.7 | 2.5 | 3.7 | 3.7 | 1.6 | 30 |
| Ex. 4 | 0.75 | | 38.8 | 8.5 | 4.9 | 3.7 | 2.5 | 3.7 | 3.7 | 1.6 | 30 |
| Ex. 5 | 1.43 | | 37.1 | 8.8 | 5.1 | 3.8 | 2.6 | 3.9 | 3.9 | 1.5 | 30 |
| Ex. 6 | 1.98 | | 34.3 | 8.8 | 5.1 | 3.8 | 2.6 | 3.9 | 3.9 | 1.4 | 32 |
| Ex. 7 | 2.46 | | 31.9 | 8.8 | 5.1 | 3.8 | 2.6 | 3.9 | 3.9 | 1.3 | 34 | rimidine, 2,6-di(acetylamino)-4-pyridyl, 2,7-diamino-1,8-naphthyridine, thymine, uracil, guanine, adenine-thymine dimer, adenine-uracil dimer, and guanine-cytosine dimer, and wherein a molar ratio of the reactive isocyanate compound to the polyol is 2 to 8.

2. The photopolymer composition of claim 1, wherein the hydrogen bonding functional group capable of forming multiple hydrogen bonds is a monovalent functional group selected from the group consisting of —OH, —OR, —NH$_2$, —NHR, —NR$_2$, —COOH, —COOR, —CONH$_2$, —CONR$_2$, —NHOH, and NROR, wherein R is a C1 to C20 aliphatic group; or a divalent functional group selected from the group consisting of —NHCO—, —NR'CO—, —O—, —NH—, —NR'—, —COO—, —CONHCO—, —CONR'CO—, —NH—NH—, —NR'—NH—, and NR'—NR'—, wherein R' is a C1 to C20 aliphatic group, a C4 to C20 alicyclic group, or a C6 to C20 aromatic group.

3. The photopolymer composition of claim 1, wherein the alicyclic or aromatic compound having at least one isocyanate group is a C4 to C20 alicyclic compound having at least one isocyanate group and substituted with at least one C1 to C10 aliphatic group, or a C6 to C20 aromatic compound having at least one isocyanate group and substituted with at least one C1 to C10 aliphatic group.

4. The photopolymer composition of claim 1, wherein the polyol has a hydroxyl equivalent weight of 1,000 g/mol to 3,000 g/mol, and the molar ratio of the reactive isocyanate compound to the polyol is 3 to 6.

5. The photopolymer composition of claim 1, wherein the photoreactive monomer comprises a polyfunctional (meth)acrylate monomer or a monofunctional (meth)acrylate monomer.

6. The photopolymer composition of claim 1, comprising:

1 wt % to 80 wt % of the polymer matrix or the precursor thereof; 1 wt % to 80 wt % of the photoreactive monomer; and 0.1 wt % to 20 wt % of the photoinitiator based on the total weight of the photopolymer composition.

7. The photopolymer composition of claim 1, further comprising a low refractive fluorine-based compound.

8. The photopolymer composition of claim 7, wherein the low refractive fluorine-based compound comprises at least one functional group selected from the group consisting of an ether group, an ester group and an amide group, and at least two difluoromethylene groups.

9. The photopolymer composition of claim 7, comprising 30 to 150 parts by weight of the low refractive fluorine-based compound based on 100 parts by weight of the photoreactive monomer.

10. A hologram recording medium with a hologram recorded in the photopolymer composition of claim 1.

11. The hologram recording medium of claim 10, having a refractive index modulation value (n) of 0.008 to 0.020.

12. The hologram recording medium of claim 10, having a hologram with a diffraction efficiency of 50% to 99.9% recorded therein.

13. A holographic optical element comprising the hologram recording medium of claim 10, with a hologram of the optical element recorded therein.

14. The holographic optical element of claim 13, wherein the optical element includes a hologram display device.

15. A holographic recording method comprising selectively polymerizing photoactive monomers contained in the photopolymer composition of claim 1 using an interferometric exposure with a coherent light source.

* * * * *